(12) United States Patent
Jackson et al.

(10) Patent No.: US 7,341,921 B2
(45) Date of Patent: Mar. 11, 2008

(54) PHOTODIODE

(75) Inventors: John Carlton Jackson, County Cork (IE); John Alderman, County Cork (IE); Alan Mathewson, County Cork (IE)

(73) Assignee: University College Cork - National University of Ireland, Cork, Cork (IL)

( * ) Notice: Subject to any disclaimer, the term of this patent is extended or adjusted under 35 U.S.C. 154(b) by 50 days.

(21) Appl. No.: 10/556,460

(22) PCT Filed: May 14, 2004

(86) PCT No.: PCT/IE2004/000072

§ 371 (c)(1),
(2), (4) Date: Nov. 10, 2005

(87) PCT Pub. No.: WO2004/102680

PCT Pub. Date: Nov. 25, 2004

(65) Prior Publication Data

US 2006/0223217 A1    Oct. 5, 2006

(30) Foreign Application Priority Data

May 14, 2003  (IE) ............................. 2003/0365

(51) Int. Cl.
*H01L 21/20* (2006.01)
*H01L 31/72* (2006.01)
*H01L 31/328* (2006.01)

(52) U.S. Cl. .................. 438/380; 257/199; 257/186
(58) Field of Classification Search ............... 257/181, 257/186, 190, 199, E29.18, E39.334, E31.063; 438/141, 143, 380
See application file for complete search history.

(56) References Cited

U.S. PATENT DOCUMENTS

| 6,995,444 B2 * | 2/2006 | Cova et al. ................ 257/438 |
| 2003/0057522 A1 * | 3/2003 | Francis et al. .............. 257/566 |

FOREIGN PATENT DOCUMENTS

| EP | 0076143 A2 | 4/1983 |
| WO | WO03/003476 | 1/2003 |

OTHER PUBLICATIONS

Patent Abstracts of Japan, vol. 0102, No. 75, Sep. 18, 1986 & JP 61 096740 A (Matsushita Electronics Corp).
W.J. Kindt, Theory of Geiger Mode Avalanche Photodiode Arrays, Chapter 4 Design and fabrication, 9 pgs., 1999.

* cited by examiner

*Primary Examiner*—Calvin Lee
(74) *Attorney, Agent, or Firm*—Jacobson Holman PLLC

(57) ABSTRACT

The invention provides a method of manufacturing an avalanche diode comprising the steps of applying a mask (6) over an active diode region (5) in a wafer (1), and damaging the region the surrounding the active diode region by breaking bonds in the semiconductor lattice to provide gettering sites in this surrounding region.

12 Claims, 2 Drawing Sheets

PHOTODIODE

This is a nationalization of PCT/IE2004/000072 filed 14 May 2004 and published in English.

The invention relates to avalanche photodiodes such as those which operate in linear avalanche mode or single photon counting Geiger mode.

In existing avalanche diodes light interacts with a silicon lattice to generate electron hole pairs which cause breakdown at a junction where there is a peak electric field. In the Geiger mode, there is a high applied bias that accelerates the electrons and holes causing impact ionisation and avalanche breakdown. It is desired that this effect only occur by electrons and holes initiated by photons. However, thermally generated electrons and holes exist which cause spurious counts, known as the dark count, in the absence of light. The presence of defects increases the dark count which is detrimental to device operation.

W. J. Kindt, "Geiger Mode Avalanche Photodiode Arrays for Spatially Resolved Single Photon Counting", Delft University Press, ISBN: 90-407-1845-8, 1999 describes a photodiode in which polysilicon is deposited over the silicon wafer within a top oxide ring. The polysilicon is doped with n-type dopant to provide an n-type cathode over a p-type anode. The junction between the cathode and the anode is the active area.

It is known to provide a guard band around the diode active region to spread out the electric field and prevent point concentrations at the edges. The guard band can be specifically implanted as a separate layer or combined into the cathode layer.

The invention addresses this problem.

STATEMENTS OF INVENTION

According to the invention there is provided a method of manufacturing an avalanche diode comprising the steps of;
applying a mask over an active diode region in a wafer,
damaging the region surrounding the active diode region by breaking bonds in the semiconductor lattice to provide gettering sites in this surrounding region.

In one embodiment the surrounding region is damaged by subjecting it to doping.

In another embodiment the surrounding region is damaged by subjecting both the mask and the surrounding region to doping.

In one embodiment the method comprises the further step of heating to cause diffusion of cathode ions from the mask into the underlying material to form a cathode.

Preferably the mask is of a material which acts to draw defects from the underlying material during the process.

In one embodiment the doping is performed so that a top layer of the mask has a high concentration of defects which have diffused from the underlying material.

In another embodiment the mask is of a polycrystalline material.

Preferably the mask is of polysilicon material.

In one embodiment the method comprises the surrounding region has the same doping as the anode.

In another embodiment the method comprises the doping is performed by arsenic implanting.

In a further embodiment the method comprises the further steps of growing an oxide ring around the diode active region.

In one embodiment doping is performed within the oxide ring.

In another embodiment the method comprises the further steps of applying a bridge from the mask to the oxide to form an Ohmic contact for the diode.

DETAILED DESCRIPTION OF THE INVENTION

The invention will be more clearly understood from the following description of some embodiments thereof, given by way of example only with reference to the accompanying drawings in which.

Figure 1:
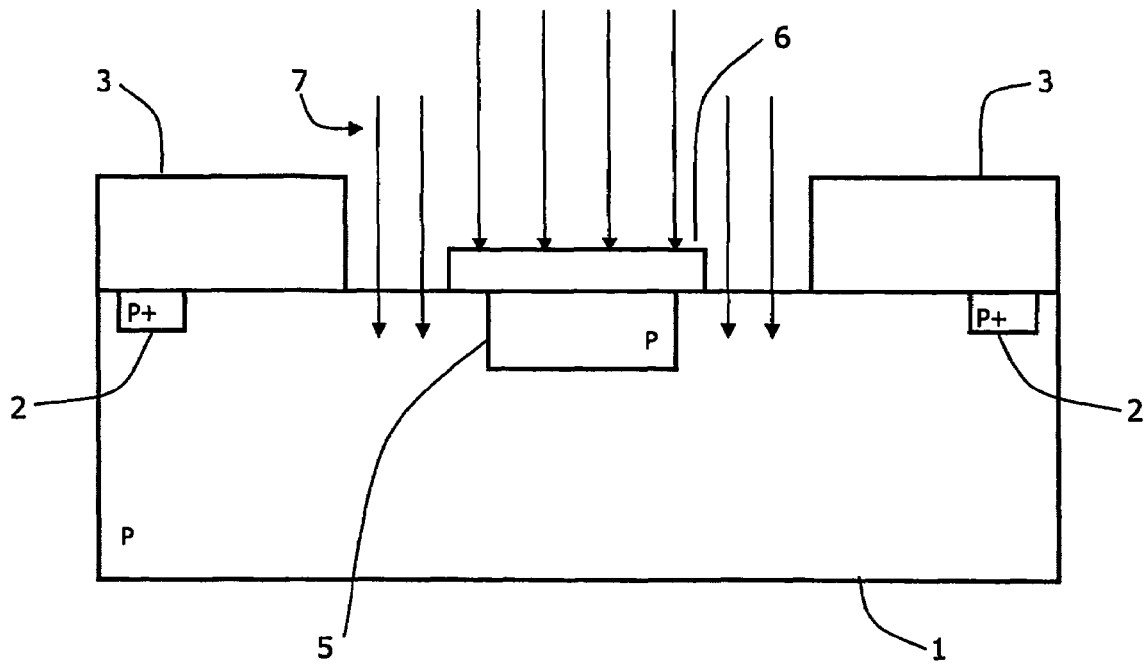
FIG. 1 is a diagrammatic cross-sectional elevational view showing production of a Geiger mode avalanche photodiode.

Referring to FIG. 1 a p-type silicon wafer 1 is provided with p+ contact regions 2 at its outer upper surface. An oxide ring 3 is grown around the upper surface of the wafer 1, leaving a circular central area for producing the diode active regions.

At the centre of this area an enhanced p-type initial anode region 5 is provided, the doping of this region being approximately two orders of magnitude greater than that of the underlying wafer 1. A disc-shaped polysilicon layer is then applied over the p-type anode 5 by deposition and etching. The thickness is approximately 200 nm thick, and the diameter is such as to be greater than that of the underlying p-type anode 5.

The area within the oxide ring 3 is then subjected to arsenic implanting. There is then heat treatment.

The arsenic implanting and the subsequent heat treatment cause the following activities to occur during manufacture:

(a) the polysilicon 6 acts as a barrier to prevent n-type doping of the bulk of the initial anode region 5 by the arsenic implant, except in a shallow top surface layer, (b) there is n+ diffusion into this shallow layer, this diffusion being from the polysilicon 6 during heating and from a surrounding region 10, (c) the surrounding region 10 is doped directly by the arsenic implant 7, thus providing a guard band to avoid point concentration at the sides in the end-product device, (d) the surrounding region 10 is highly damaged by the arsenic implanting due to the presence of the polysilicon 6, and thus it provides a substantial number of gettering sites for substantial migration of defects from the region below the polysilicon, (e) the polysilicon itself, due to its grainy crystalline structure, also provides gettering sites for migration of defects from the underlying material.

Figure 2:
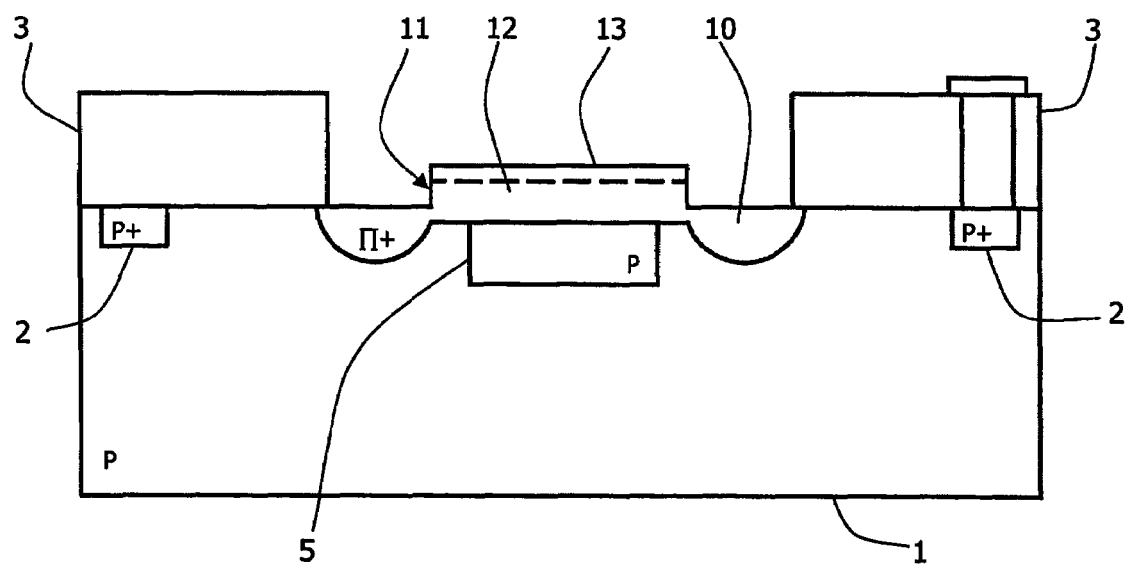
FIG. 2 is a similar view when fabrication is complete.

Referring again to FIG. 2, the result of these activities is that the polysilicon 6 transforms to a hybrid structure 11 comprising a lower region 12 of n+ doping arising from arsenic implanting of the polysilicon 6 and migration of n+ into the top of the initial anode region 5, and an upper region 13 rich in defects. The region 13 arises because of the migration of defects from underneath.

Figure 3:
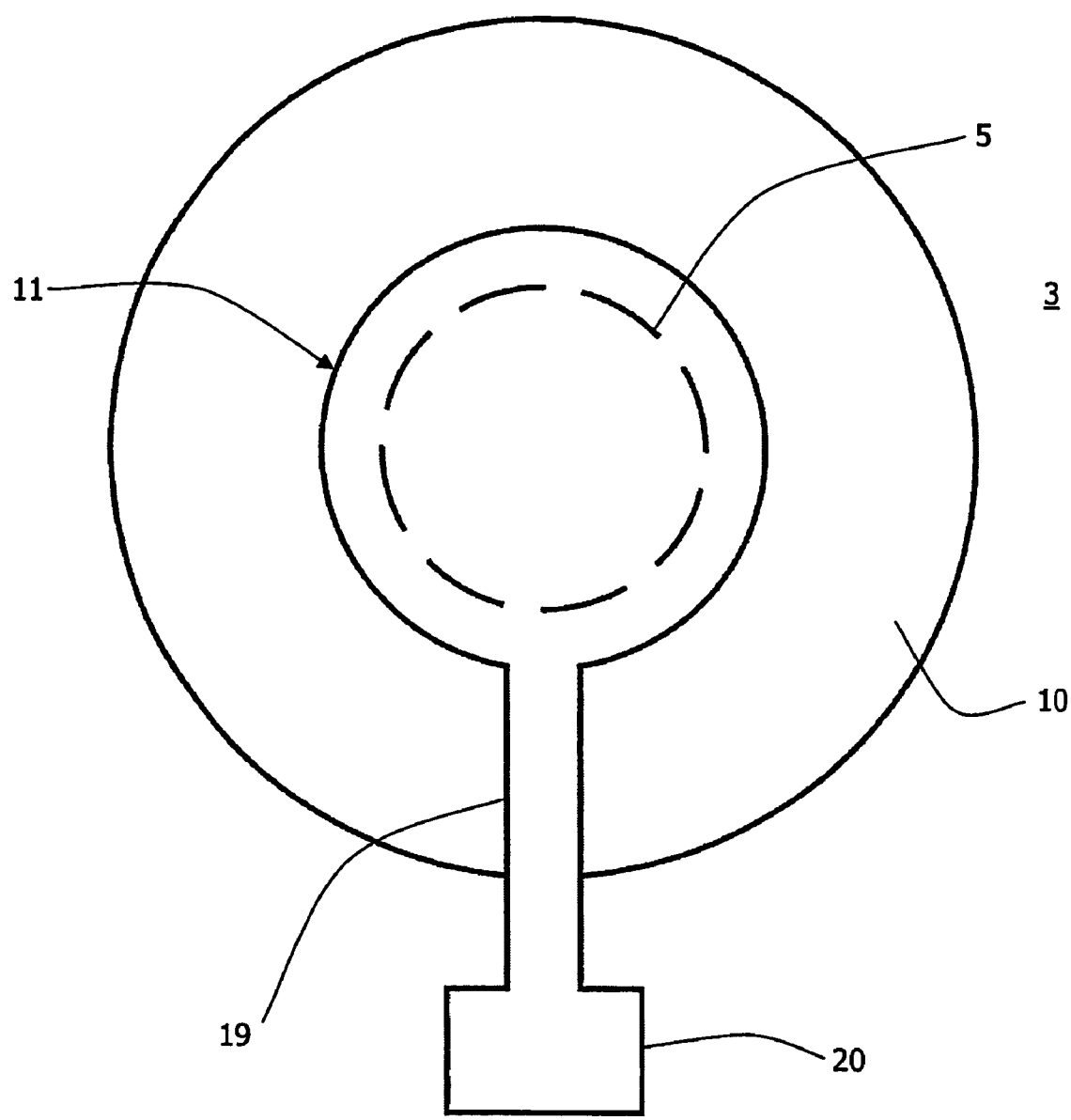
FIG. 3 is a plan view of the detector.

As shown in FIG. 3 the avalanche diode is completed by applying a polysilicon bridge 19 to a metal Ohmic contact 20 on the oxide 3. This arrangement avoids the possibility of the Ohmic metal such as aluminium giving rise to diffusion of ions into the underlying p-type material which might occur if the contact were directly on the p-type material.

It will thus be appreciated that the polysilicon 6 and the processing steps give rise to several advantages simultaneously during production. The region 10 around the active diode regions is particularly damaged because of presence of the polysilicon 6 acting as a mask for the central disc region. The damaged region 10 actively draws defects away from the active regions, and at the same time the polysilicon itself also draws defects upwardly. This double attraction of defects helps to achieve a particularly pure, defect-free diode active region. Also, the polysilicon effectively merges with a shallow top layer of the initial anode region 5 to form the cathode 12 by diffusion of n+ downwardly during heating. Furthermore, the polysilicon can then provide an Ohmic contact.

The invention advantageously enables the use of a polysilicon layer to form the cathode region, cathode contact, guard band, and provide a area of increased defect removal at the edges of the guard band.

In the embodiment described doping is used to damage the region surrounding the active diode region this is because this doping achieves multiple purposes of doping the region under the mask to form the cathode and at the same time damaging the surrounding region, it is therefore very efficient. However, it is envisaged that the surrounding region may be damaged in any other appropriate manner which selectivly breaks bonds in the semiconductor lattice in this surrounding region for example, this may be achieved mechanically.

The invention is not limited to the embodiments described but may be varied in construction and detail.

The invention claimed is:

1. A method of manufacturing an avalanche diode, said method comprising the steps of
   applying a mask over a diode active region in a wafer,
   damaging the region surrounding the active diode region by breaking bonds in the semiconductor lattice to provide gettering sites in the surrounding region, and
   heating to cause diffusion of cathode ions from the mask into an underlying material to form a cathode and the mask being of a material which acts to draw defects from the underlying material.

2. The method as claimed in claim 1, wherein the surrounding region is damaged by subjecting it to doping.

3. The method as claimed in claim 1, wherein the surrounding region is damaged by subjecting both the mask and the surrounding region to doping.

4. The method as claimed in claim 1, comprising the further step of heating to cause diffusion of cathode ions from the mask into the underlying material to form a cathode.

5. The method as claimed in claim 1, wherein the mask is of a polycrystalline material.

6. The method as claimed in claim 1, wherein the mask is of polysilicon material.

7. The method as claimed in claim 1, wherein the surrounding region has the same doping as the anode.

8. The method as claimed in claim 1, wherein the surrounding region is damaged by subjecting it to doping; and wherein the doping is performed by arsenic implanting.

9. The method as claimed in claim 1, comprising the further steps of growing an oxide ring around the diode active region.

10. The method as claimed in claim 1, comprising the further steps of growing an oxide ring around the diode active region; and wherein doping is performed within the oxide ring.

11. The method as claimed in claim 1, comprising the further steps of growing an oxide ring around the diode active region; and comprising the further steps of applying a bridge from the mask to the oxide to form an Ohmic contact for the diode.

12. A method of manufacturing an avalanche diode, said method comprising the steps of
    applying a mask over a diode active region in a wafer,
    damaging the region surrounding the active diode region by breaking bonds in the semiconductor lattice to provide gettering sites in the surrounding region, and
    heating to cause diffusion of cathode ions from the mask into an underlying material to form a cathode and the mask being of a material which acts to draw defects from the underlying material and doping being performed so that a top layer of the mask has a high concentration of defects which have diffused from the underlying material.

* * * * *